US011469141B2

(12) United States Patent
Wyant et al.

(10) Patent No.: US 11,469,141 B2
(45) Date of Patent: Oct. 11, 2022

(54) LASER DICING FOR SINGULATION

(71) Applicant: Texas Instruments Incorporated, Dallas, TX (US)

(72) Inventors: Michael Todd Wyant, Dallas, TX (US); Dave Charles Stepniak, Allen, TX (US); Matthew John Sherbin, Dallas, TX (US); Sada Hiroyuki, Beppu (JP); Shoichi Iriguchi, Beppu (JP); Genki Yano, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 430 days.

(21) Appl. No.: 16/057,126

(22) Filed: Aug. 7, 2018

(65) Prior Publication Data
US 2020/0051860 A1    Feb. 13, 2020

(51) Int. Cl.
*H01L 21/78* (2006.01)
*H01L 23/58* (2006.01)
*H01L 21/683* (2006.01)
*H01L 21/67* (2006.01)
*H01L 21/268* (2006.01)

(52) U.S. Cl.
CPC ............ *H01L 21/78* (2013.01); *H01L 21/268* (2013.01); *H01L 21/67092* (2013.01); *H01L 21/6836* (2013.01); *H01L 23/585* (2013.01); *H01L 2221/68327* (2013.01)

(58) Field of Classification Search
CPC ... H01L 23/562; H01L 23/544; H01L 23/564; H01L 21/32134; H01L 21/304; H01L 21/31111; H01L 21/76; H01L 21/78

USPC ........ 257/620, 676, 734; 438/113, 458, 462, 438/463
See application file for complete search history.

(56) References Cited

U.S. PATENT DOCUMENTS

| | | | |
|---|---|---|---|
| 2009/0203192 A1* | 8/2009 | Kaltalioglu et al. | ......................... H01L 21/3116 438/462 |
| 2010/0127355 A1* | 5/2010 | Mariani et al. | ......... H01L 21/78 257/260 |
| 2012/0211748 A1* | 8/2012 | Micoli et al. | ........ B23K 26/032 257/52 |
| 2014/0117505 A1* | 5/2014 | Mackh et al. | ........ H01L 23/562 257/760 |
| 2014/0213042 A1* | 7/2014 | Lei et al. | ................ H01L 21/78 438/462 |
| 2015/0024550 A1* | 1/2015 | Voerckel et al. | ....... H01L 21/82 438/113 |

(Continued)

*Primary Examiner* — Thinh T Nguyen
(74) *Attorney, Agent, or Firm* — Dawn Jos; Charles A. Brill; Frank D. Cimino

(57) ABSTRACT

In a described example, a method includes: applying a dicing tape over a metal layer covering a portion of a surface of scribe streets on a device side of a semiconductor wafer that includes semiconductor device dies formed thereon separated from one another by the scribe streets; and placing the semiconductor wafer with the device side facing away from a laser in a stealth dicing machine. A power of a laser beam is adjusted to a first power level. The laser beam is focused through the non-device side of the semiconductor wafer to a first focal depth in the metal layer. The laser beam scans across the scribe streets and ablates the metal layer in the scribe streets. The method continues by singulating the semiconductor device dies using stealth dicing along the scribe streets in the stealth dicing machine.

7 Claims, 9 Drawing Sheets

FIG. 6B

(56) References Cited

U.S. PATENT DOCUMENTS

| | | | |
|---|---|---|---|
| 2017/0256500 A1* | 7/2017 | Park et al. | H01L 23/544 |
| 2018/0096952 A1* | 4/2018 | Micolli | H01L 23/562 |
| 2019/0157150 A1* | 5/2019 | Park et al. | H01L 21/78 |

* cited by examiner

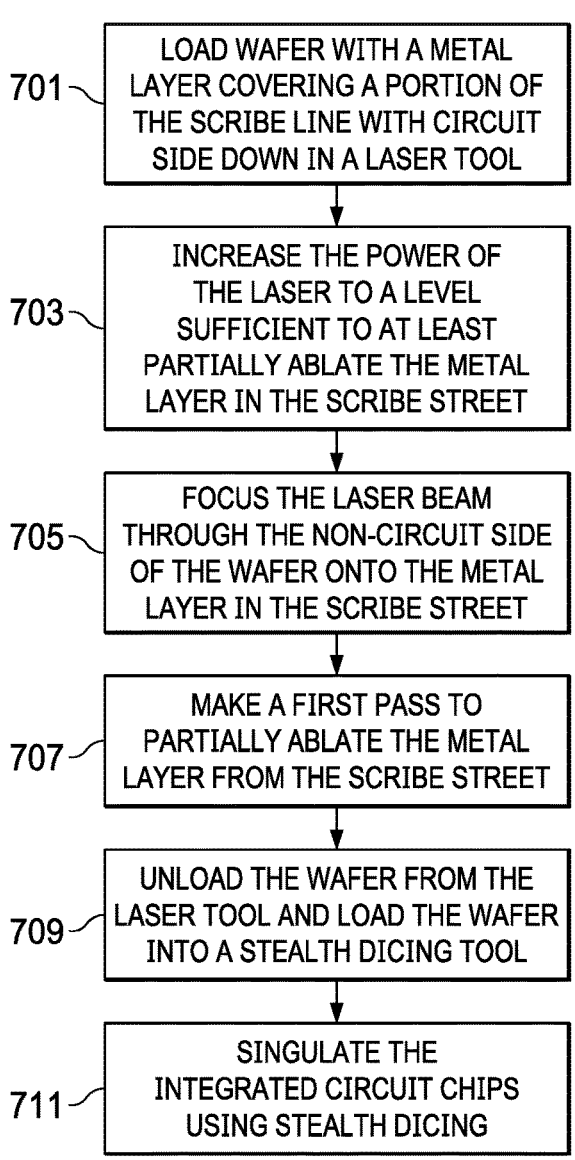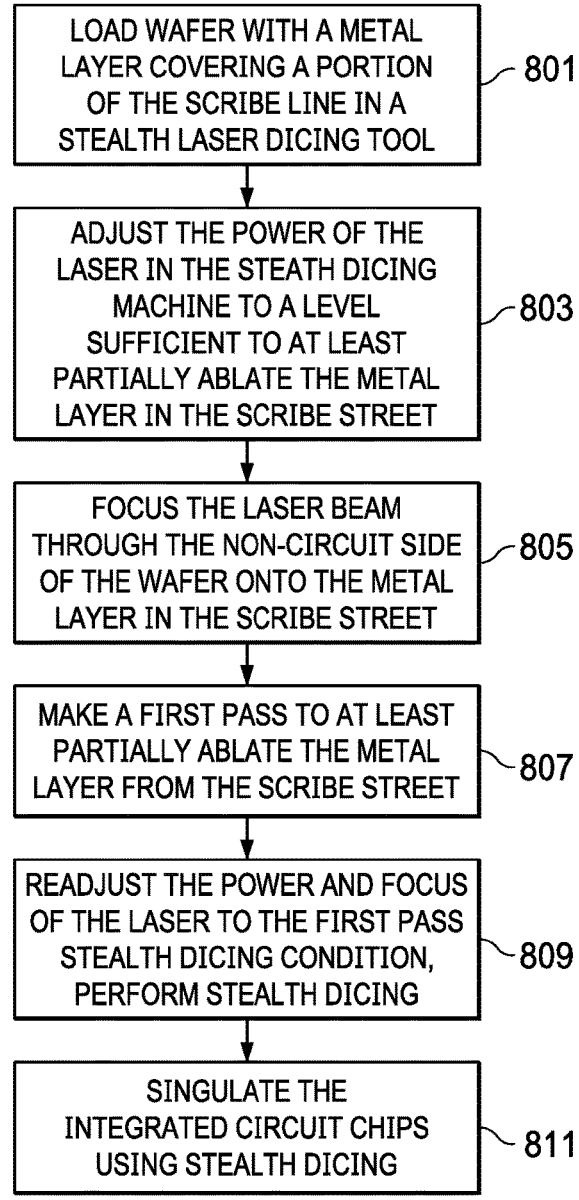
FIG. 7
FIG. 8

LASER DICING FOR SINGULATION

TECHNICAL FIELD

This disclosure relates generally to semiconductor device dies, and more particularly to semiconductor device die singulation using laser dicing.

BACKGROUND

In semiconductor wafer processing, a step performed prior to packaging is semiconductor device die singulation. Singulation is typically accomplished either by sawing scribe streets that are formed between the semiconductor device dies on a semiconductor wafer using a saw blade or by cutting the semiconductor wafer apart along the scribe streets with a laser. Stealth dicing singulation can be used where laser energy is focused at various depths in the semiconductor wafer. The energy laser energy melts the single crystalline semiconductor material and the related stress can form a crack. The crack propagates through the semiconductor wafer to singulate the semiconductor device dies. However, when using stealth dicing where metal is present over the scribe street areas, metal bridging can occur that prevents effective singulation of semiconductor device dies.

SUMMARY

In a described example, a method includes: applying a dicing tape over a metal layer covering a portion of a surface of scribe streets on a device side of a semiconductor wafer that includes semiconductor device dies formed thereon separated from one another by the scribe streets; and placing the semiconductor wafer with the device side facing away from a laser in a stealth dicing machine. A power of a laser beam is adjusted to a first power level. The laser beam is focused through the non-device side of the semiconductor wafer to a first focal depth in the metal layer. The laser beam scans across the scribe streets and ablates the metal layer in the scribe streets. The method continues by singulating the semiconductor device dies using stealth dicing along the scribe streets in the stealth dicing machine.

BRIEF DESCRIPTION OF THE DRAWINGS

FIG. 7 is a flow diagram describing a method of singulating semiconductor device die using a laser tool for metal ablation and a stealth dicing tool.

FIG. 8 is a flow diagram describing a method of singulating semiconductor device dies using a stealth dicing tool for metal ablation and for dicing.

DETAILED DESCRIPTION

Corresponding numerals and symbols in the different figures generally refer to corresponding parts, unless otherwise indicated. The figures are not necessarily drawn to scale. The device side (frontside) of semiconductor device wafer is the side of the wafer on which electrical devices are constructed. The non-device side (backside) of a semiconductor device wafer is the opposite side of the wafer that is polished in a back-grind machine to thin the wafer prior to dicing. Semiconductor devices can include complex integrated circuits such as microprocessors or cell phone chips and individual semiconductor devices such as power transistors and precision capacitors and resistors.

"Stealth dicing" is described as part of the arrangements herein. Stealth dicing uses energy to melt portions of a semiconductor wafer, but does not cut through the semiconductor wafer entirely, instead cracks are formed that propagate through the semiconductor wafer. A laser stealth dicing (SD) method developed by Hamamatsu Photonics uses infrared (IR) light with a wavelength (>1000 nm). Single crystal silicon is transparent to IR light at these frequencies. The term "ablate" is used herein. "Ablate" as used herein means to remove, weaken or destroy material by cutting, evaporation, melting, or abrading. The term "ablated edge" as used herein is an edge along a periphery of a semiconductor device that was formed by performing laser ablation in scribe streets along the periphery of the semiconductor device, and subsequently singulating the semiconductor device die to form the ablated edge. Because the ablated edge of a metal layer melts and then cools in the laser ablation process of the arrangements, it will have a smooth appearance, in sharp contrast to a sawed metal edge formed in sawing singulation, where the metal edge is roughened by the mechanical sawing process.

Figure 1A:
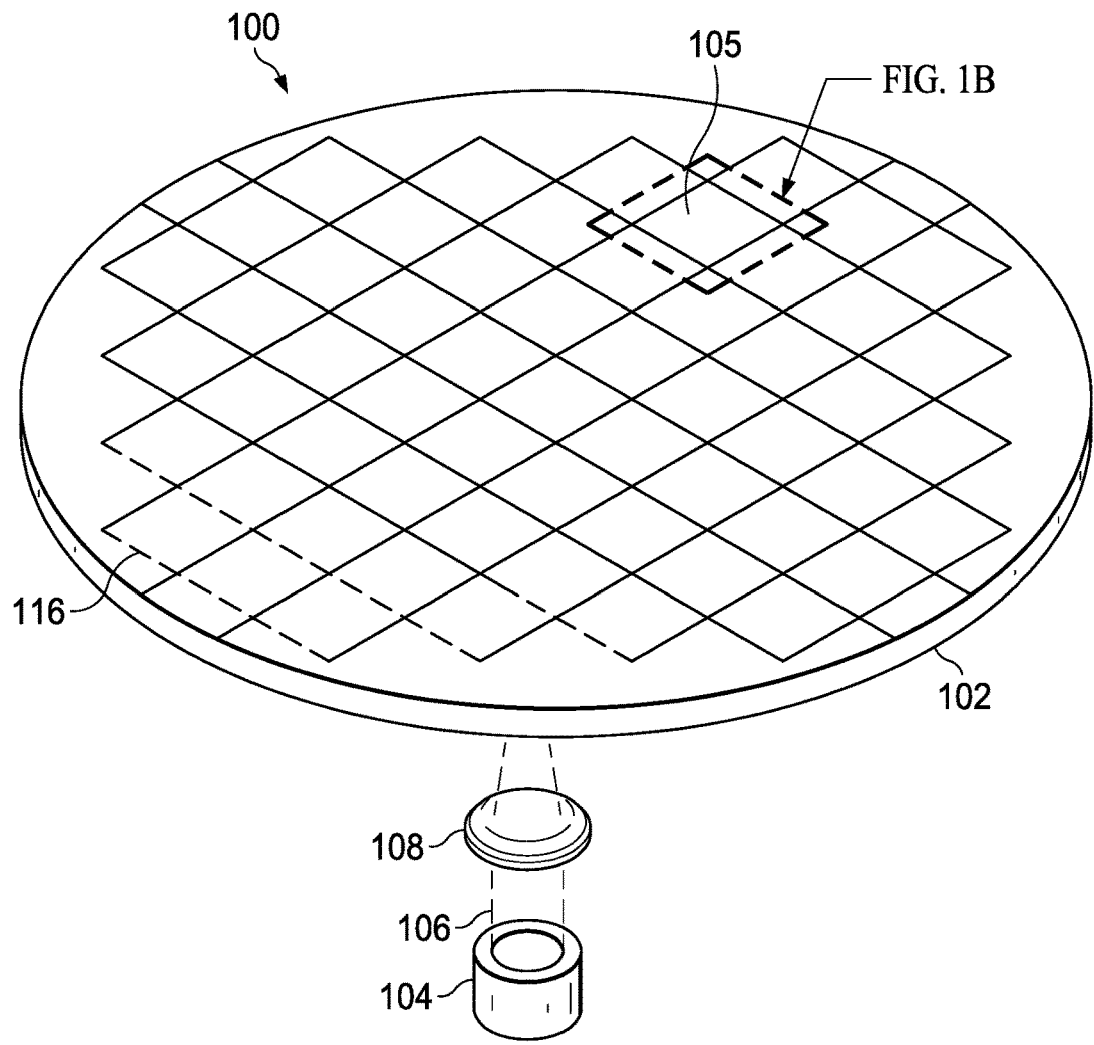
FIG. 1A is a projection view illustrating stealth dicing of a semiconductor device wafer and FIG. 1B is a singulated semiconductor device die from the wafer
Figure 1B:
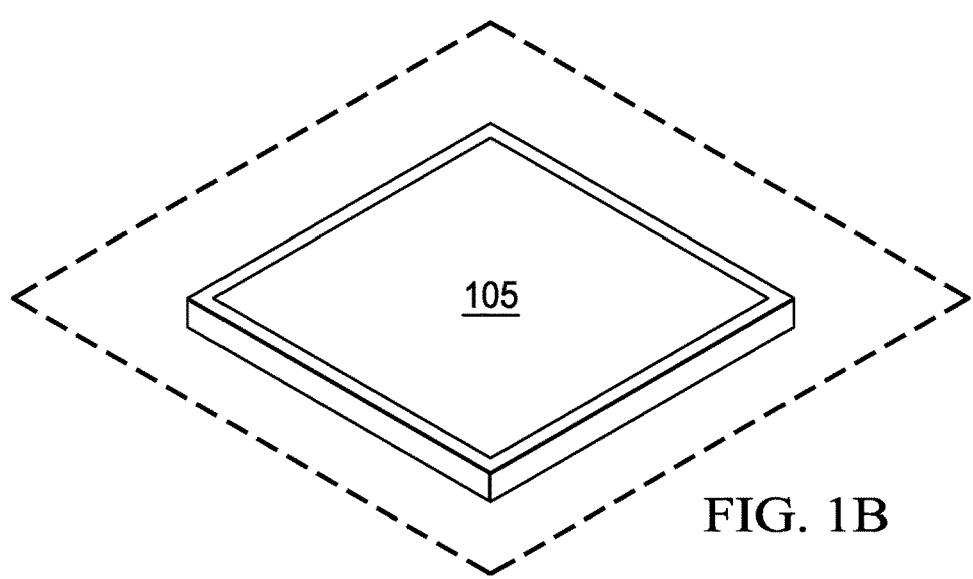

The SD process is illustrated in FIGS. 1A, 1B, 2A, and 2B. In stealth dicing, an infrared (IR) light beam 106 from a laser 104 is focused with a lens 108 through the non-device side of the semiconductor wafer 102 to a point in the scribe street 116 on the device side of the semiconductor wafer 102. The scribe street 116 is a portion of the semiconductor wafer 102 that separates semiconductor device dies 105 formed on the device side of semiconductor wafer 102. The IR light beam 106 melts silicon in the scribe streets 116 causing stress cracks in the scribe streets 116 between the semiconductor device dies 105. The stress cracks are then expanded to singulate the semiconductor device dies 105 one from another as shown in FIG. 1B.

Figure 2A:
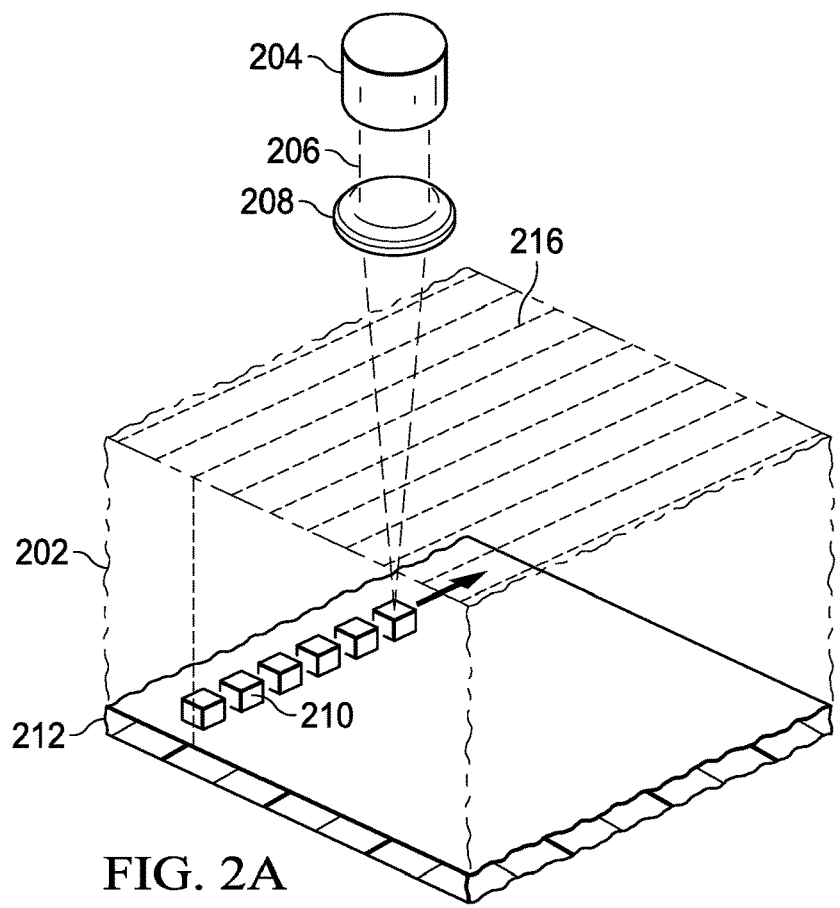
FIG. 2A is a projection view and FIG. 2B is a cross section illustrating stealth dicing of a semiconductor device wafer.
Figure 2B:
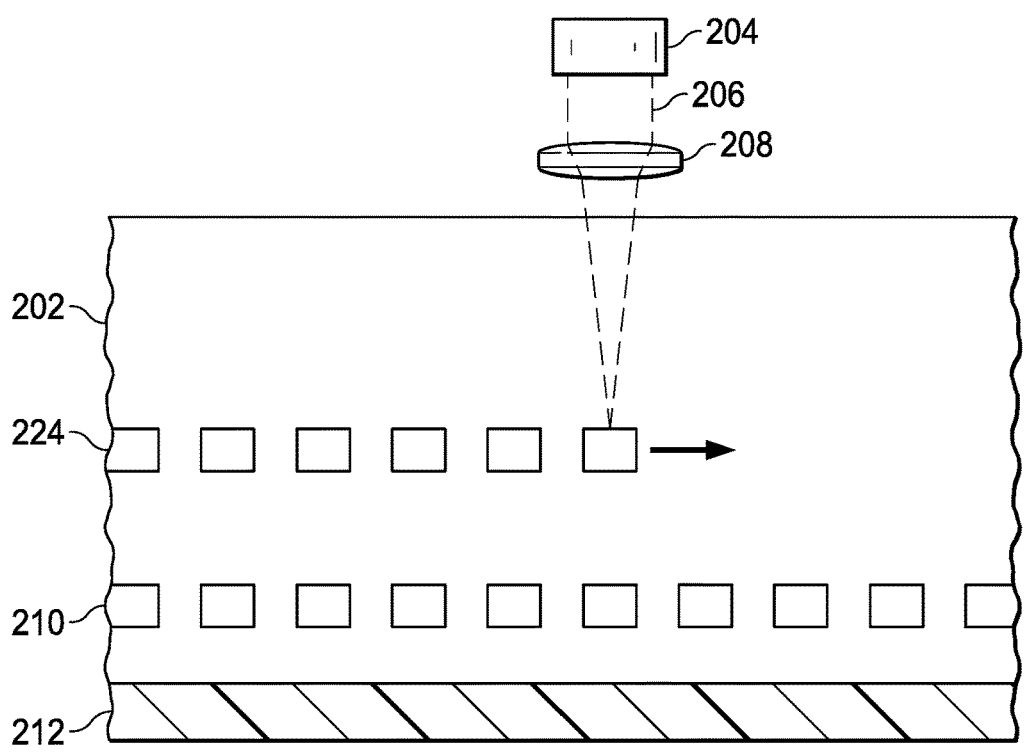

In FIG. 2A, similar reference labels are used for similar elements shown in FIG. 1A, for clarity. For example, in FIG. 2A scribe street 216 corresponds to scribe street 116 in FIG. 1A. Dashed lines in FIG. 2A indicate the position of scribe streets 216 on the non-device side ("backside") of a portion of the semiconductor wafer 202. Dicing tape 212 covers the device side ("frontside") of the semiconductor wafer 202 during the process. In one example, the semiconductor wafer 202 is placed with the device side contacting the chuck in an SD machine. Concentrated energy from the laser beam 206 at the focal point within the semiconductor wafer 202 causes the single crystal semiconductor wafer material to melt and become polycrystalline (210 in FIGS. 2A-2B). The volume of the polycrystalline 210 is greater than the volume of the surrounding single crystal semiconductor material. The excess volume exerts pressure on the single crystal semiconductor wafer 202, causing a stress crack to form. As illustrated in FIG. 2B the laser beam 206 can be focused to multiple depths within the semiconductor wafer 202 forming multiple polycrystalline regions 210 and 224 in the scribe streets 216 across the semiconductor wafer 202.

Figure 3A:
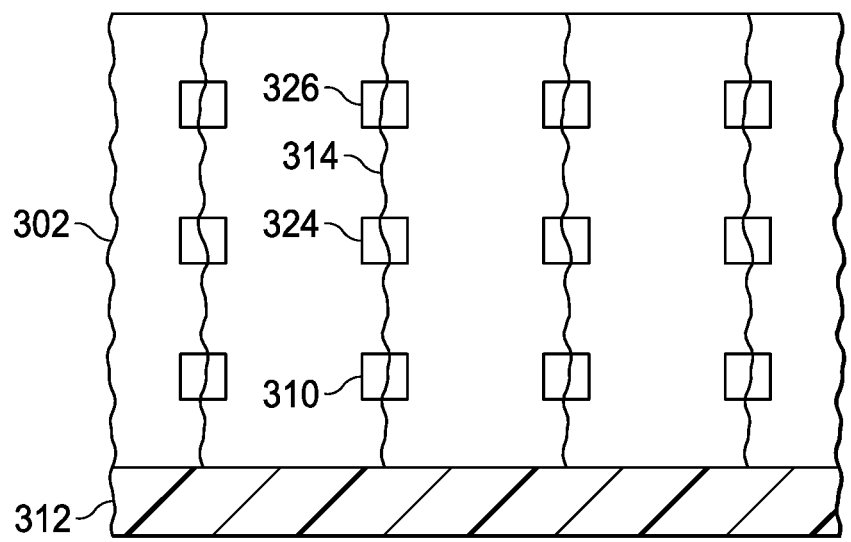
FIGS. 3A and 3B are cross sections illustrating stealth dicing of a semiconductor device wafer.
Figure 3B:
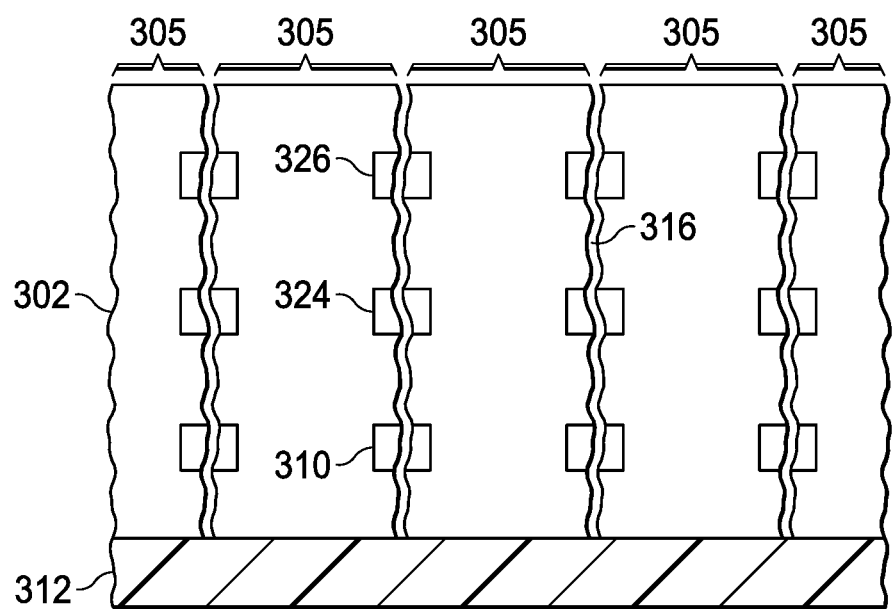

In FIGS. 3A and 3B, similar reference labels are used for similar elements shown in FIG. 2A, for clarity. For example, in FIG. 3B scribe street 316 corresponds to scribe street 216 in FIG. 2A. In FIGS. 3A and 3B a semiconductor wafer 302 is positioned with the device side in contact with a dicing tape 312. The dicing tape 312 provides mechanical support for the semiconductor wafer 302 during the singulation process. As shown in the cross section of the semiconductor wafer 302 in FIG. 3A, the stress from multiple polycrystalline regions 310, 324, and 326, displaced vertically at different depths in the scribe street 316, causes a crack 314 to form that propagates and penetrates completely through the semiconductor wafer 302 extending from the device side to the non-device side. Stealth dicing machines are made by such companies as Hamamatsu, Accretech, Disco, and others.

As shown in FIG. 3B, after cracks 314 are formed through the semiconductor wafer 302 in the scribe streets 316, the dicing tape 312 is stretched to open the cracks 314 in the scribe streets 316, singulating the semiconductor device dies 305. The singulated semiconductor device dies 305 can then be removed from the dicing tape 312. The term "peripheral edge" is used herein to describe the edges of the semiconductor device dies that is formed when the dies are separated one from another by the singulation process. A portion of the scribe street semiconductor material will be at the peripheral edge of the semiconductor dies because the singulation process cuts through the semiconductor wafer in the scribe streets, leaving a portion of the scribe street at the peripheral edges of the adjacent dies on either side of the scribe streets.

Figure 4A:
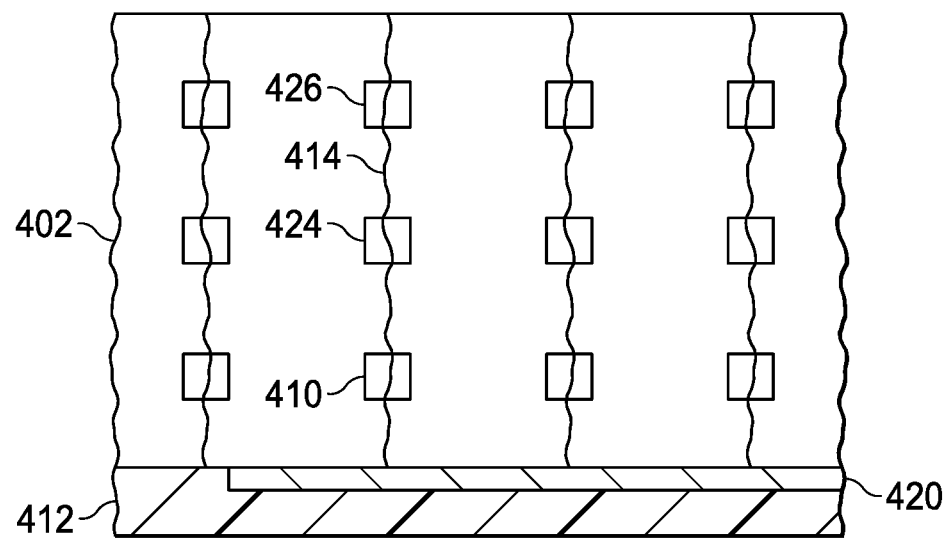
FIGS. 4A and 4B are cross sections illustrating the formation of metal bridges across a scribe street during stealth dicing of a semiconductor device wafer with a surface metal layer in the scribe street.
Figure 4B:
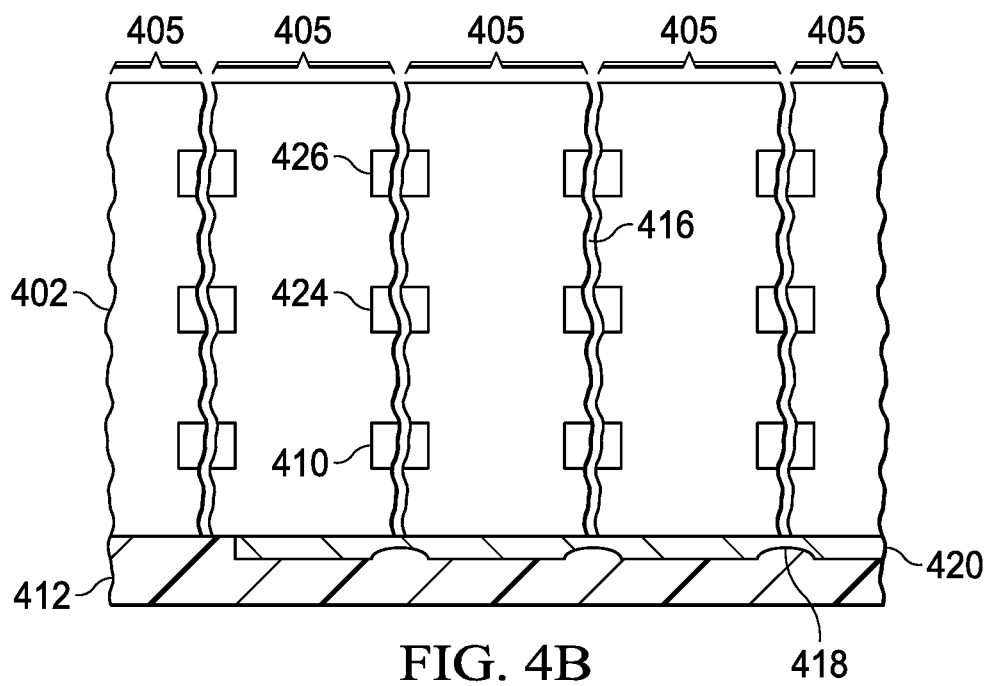

FIGS. 4A and 4B present cross sectional views of a semiconductor wafer 402 on a dicing tape 412. In FIGS. 4A and 4B, similar reference labels are used for similar elements shown in FIGS. 3A and 3B, for clarity. For example, dicing tape 412 in FIGS. 4A and 4B corresponds to dicing tape 312 in FIGS. 3A and 3B. FIG. 4A illustrates a portion of a semiconductor wafer 402 in which portions of the scribe street 416 on the device side of the semiconductor wafer 402 are covered with a metal layer 420. For example, bond pad metal on the individual semiconductor device dies 405 formed on the semiconductor wafer 402 may remain unpatterned and unetched on the scribe streets 416. The metal layer 420 in the scribe streets 416 may be the result of partial semiconductor device dies that were printed on the edges of the semiconductor wafer 402 during fabrication of the semiconductor devices on the semiconductor wafer 402.

As is illustrated in FIG. 4B, after the stealth dicing process is performed and the dicing tape 412 is stretched to open the cracks the scribe streets 416, the metal layer 420 may also stretch forming metal bridges 418 between adjacent semiconductor device dies 405, and preventing singulation of the dies 405. Improvements are needed for stealth dicing of wafers with device side surface metallization over the scribe street.

Typical stealth dicing (SD) process conditions for a 55 micron thick silicon wafer are listed in Table 1. The depth numbers are the focal depths measured from the non-device side ("backside") of the wafer 402. In an example SD process, the deepest scan is performed first and the shallowest scan last.

Referring to FIGS. 4A and 4B, the first polysilicon layer 410 is formed first near the device side of the semiconductor wafer 402 and the last polysilicon layer 426 is formed last near the non-device side semiconductor wafer 402. As described hereinabove, the polysilicon formed by the laser energy has greater volume than the surrounding silicon material, thus stressing the silicon to enable cracks to form and propagate through the silicon material.

The infrared (IR) laser wavelength used for SD of single crystal silicon wafers is typically greater than 1000 nm. Single crystal silicon is transparent to IR of these frequencies. In the example process of Table 1, the laser light of the SD process is pulsed at a frequency of 1 kilohertz. There are two passes made with one of the passes split. In the split pass, 1.1 W of the laser beam energy is focused to a first focal depth in the semiconductor wafer 402 and 1.1 W of the laser beam energy is focused at a second focal depth in the semiconductor wafer 402. In the example stealth dicing process illustrated in Table 1 the first stealth dicing (SD) pass is a split beam pass with a first focal depth of 38 microns and a second focal depth of 28 microns measured from the non-device side of the semiconductor wafer 402. Two polysilicon regions, 410 and 424, are formed during the first pass. A second SD pass is performed with a laser power of 1.4 W and a focal depth of 14 microns to form a third polysilicon region 426. The depths are measured from the non-circuit side of the semiconductor wafer which faces the laser in the stealth dicing or laser tool.

TABLE 1

| Pulse frequency | 100 kHz |
| --- | --- |
| Scan speed | 800 mm/sec |
| Number of passes | 1 split + 1 |
| Distance Split | −10 μm |
| Depth | 28 μm & 14 μm |
| Power | (1.1 W/1.1 W) + 1.4 μm |

In the arrangements, a laser can be used to at least partially ablate metal covering the scribe streets on the wafer. In Table 2 the laser power is adjusted to 1.5 W to ablate metal. The addition of a laser scan to perform metal ablation prior to the SD process eliminates the formation of metal bridges 418 (see FIG. 4B).

TABLE 3

| Pulse frequency | 100 kHz |
| --- | --- |
| Scan speed | 800 mm/sec |
| Number of passes | 1 + 1split + 1 |
| Distance Split | −10 um |
| Height | 56 μm & 28 μm & 14 μm |
| Power | 1.5 W + (1.1 W/1.1 W) + 1.4 W |

TABLE 2

| Pulse frequency | 100 kHz |
| --- | --- |
| Scan speed | 800 mm/sec |
| Number of passes | 1 |
| Distance Split | na |
| Depth | 56 μm |
| Power | 1.5 W |

An example set of laser metal ablation conditions for a 55 um thick silicon wafer with a device side surface metal layer 420 (FIG. 4A) are listed in Table 2. Alternative conditions with a different pulse frequency, different scan speed and different power are also possible and form additional arrangements. The metal ablation laser conditions can be adjusted for different metal layer 420 thicknesses and the depth can be adjusted for different thicknesses of semiconductor wafer 402.

In an example arrangement, the laser metal ablation pass is performed first. The SD process is performed after the laser metal ablation pass. The laser metal ablation pass can be performed in a first laser tool and the SD can be performed in a second laser tool following the method illustrated in the flow diagram in FIG. 7.

In step 701 a semiconductor wafer with metal covering a portion of the scribe street is loaded into a laser tool with the device side facing the chuck.

In step 703 the power of a laser is adjusted to a level sufficient to ablate the metal covering the scribe streets. In an example arrangement the power of the laser is in the range of 0.2 Watts to 3 Watts. The power of the laser can be adjusted using sample material to ensure sufficient ablation of the metal layer is achieved.

In step 705 the laser beam is focused onto the metal through the non-device side of the wafer.

In step 707 the laser is scanned while ablating the metal from the scribe street. The metal at least partially ablates, is melted and cut or partially cut to enable singulation without bridging. The affected areas of the metal may form burned or darkened areas that are oval shaped and may be spaced from one another by unaffected areas, so that the metal layer is perforated. The spacing of the affected metal areas will correspond to the frequency of the laser pulses and the scanning speed, parameters which can be adjusted in the laser machine. The metal affected by the laser ablation will appear to be melted or burned and some vaporization may occur.

In step 709 the wafer is unloaded from the laser tool and loaded into a stealth dicing tool with the device side of the wafer facing the chuck.

In step 711 semiconductor device dies on the semiconductor device wafer are singulated along scribe streets with a stealth dicing process as described hereinabove.

A method for performing metal ablation from the scribe streets and performing stealth dicing in the same laser tool or same stealth dicing tool is described in the flow diagram in FIG. 8. In this arrangement, the laser in the laser tool or stealth dicing tool has the power range and focus range to both at least partially ablate metal over the scribe streets and to perform the stealth dicing process.

Table 2 lists the laser metal ablation conditions and Table 3 lists the SD conditions that can be used to perform both the laser metal ablation pass and the SD passes in the same laser tool. In this arrangement, the power and focus depth of the SD laser is first adjusted to perform metal ablation before readjusting the laser power and focus for melting single crystal silicon in the SD process.

All the conditions for the SD process in Table 3 are the same as in Table 1. Process conditions for the metal ablation scan are added.

The metal ablation plus SD process being performed in the same laser tool is illustrated in FIGS. 5A through 5F and shown as steps 801-811 in the flow diagram FIG. 8. In FIGS. 5A through 5F, similar reference labels are used for similar elements shown in FIGS. 2A and 2B, for clarity. For example, semiconductor wafer 502 in FIGS. 5A through 5F correspond to the semiconductor wafer 202 in FIGS. 2A and 2B. The example metal ablation process conditions listed in Table 3 are used for illustration. Other metal ablation process conditions can be used for other types and thicknesses of metal and for other types and thicknesses of semiconductor wafers.

In step 801 in FIG. 8 the semiconductor wafer (502 in FIG. 5A) with a metal layer covering a portion of the scribe street is loaded with the device side of the semiconductor wafer facing the chuck in the stealth dicing tool.

In step 803 the power of the laser is adjusted to a level sufficient to ablate the metal layer.

Figure 5A:
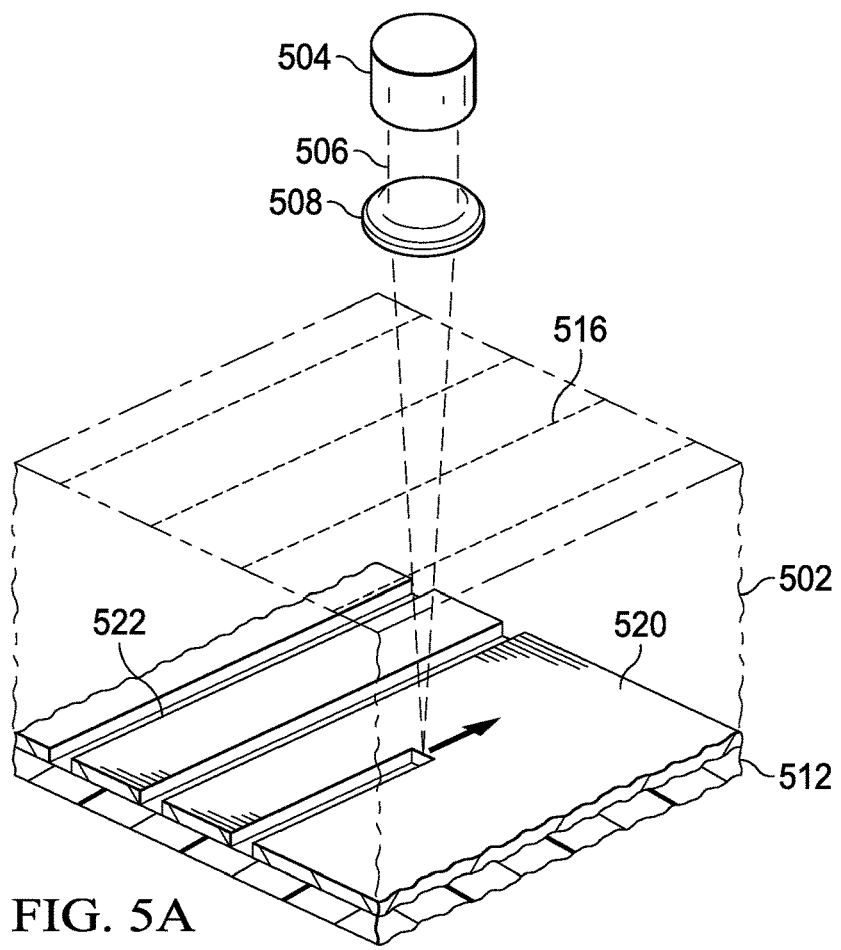
FIGS. 5A through 5F are projection views and cross section views of the laser metal ablation plus stealth dicing semiconductor device die singulation procedure.

A projection view of the metal ablation step is illustrated in FIG. 5A. Dicing tape 512 is applied over the metal layer 520 on the device side of the semiconductor wafer 502. Dashed lines on the opposing non-device side indicate the location of scribe streets 516. The semiconductor wafer 502, which is transparent to the IR beam 506, is placed with the non-device side of the semiconductor wafer 502 oriented towards the laser in the SD machine. The power of the IR beam 506 from laser 504 is adjusted and is focused by the lens 508 through the non-device side of the semiconductor wafer 502 so that the focal point of the IR beam 506 is on the metal layer 520. The focused IR beam 506 provides sufficient energy to ablate the metal layer 520 from the scribe streets 516 forming a metal free region 522.

Figure 5B:
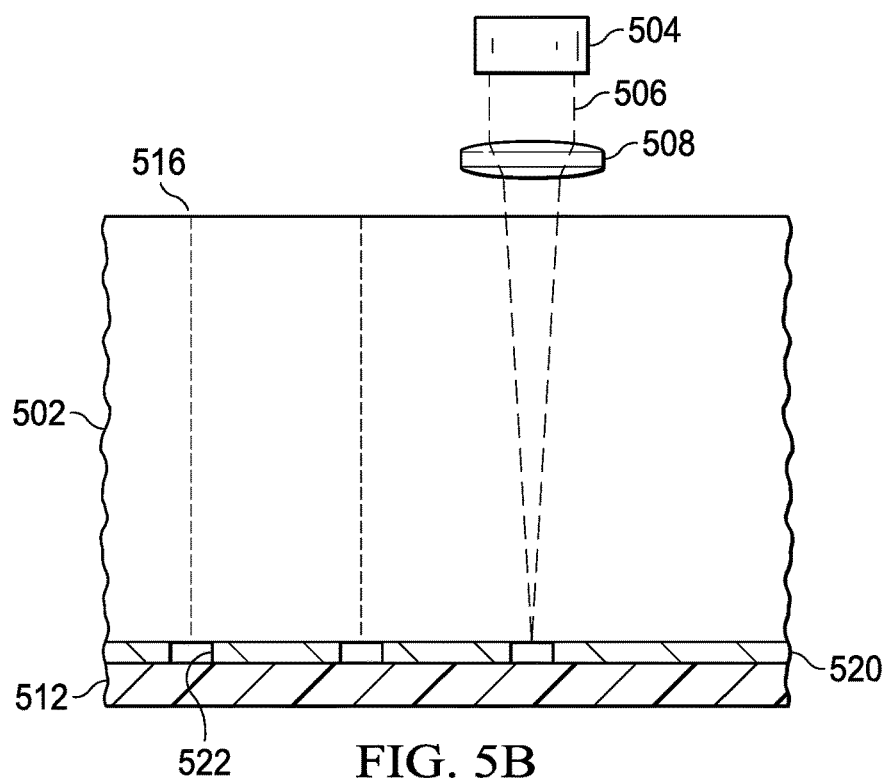

FIG. 5B shows a cross sectional view of the semiconductor wafer 502 during the metal ablation step. Metal layer 520 is on the surface of the device side (frontside facing the chuck) of the semiconductor wafer 502. The IR beam 506 from the laser 504 is focused (step 805 in FIG. 8) through the non-device (backside, now facing the laser) side of the semiconductor wafer 502 and onto the metal layer 520 on the surface of the device side of the semiconductor wafer 502 where the metal layer 520 covers a portion of the scribe street 516. The power of the IR beam 506 is adjusted (step 803 in FIG. 8) to a level sufficient to ablate the metal layer 520. The metal layer 520 is ablated from the scribe street 516 forming (step 807 in FIG. 8) a metal free region 522 in the scribe street 516. For an example using the ablation process in Table 2, the focal point depth is 56 um, the power is 1.5 W, and the scan speed is 800 mm/sec. The focal depth can be adjusted to compensate for other wafer thicknesses. The laser power and scan speed can be adjusted to compensate for other thicknesses of metal and for other metal types. Various metals can be used in semiconductor processes such as copper and aluminum. Process conditions can be adjusted to ablate the various metals used.

Figure 5C:
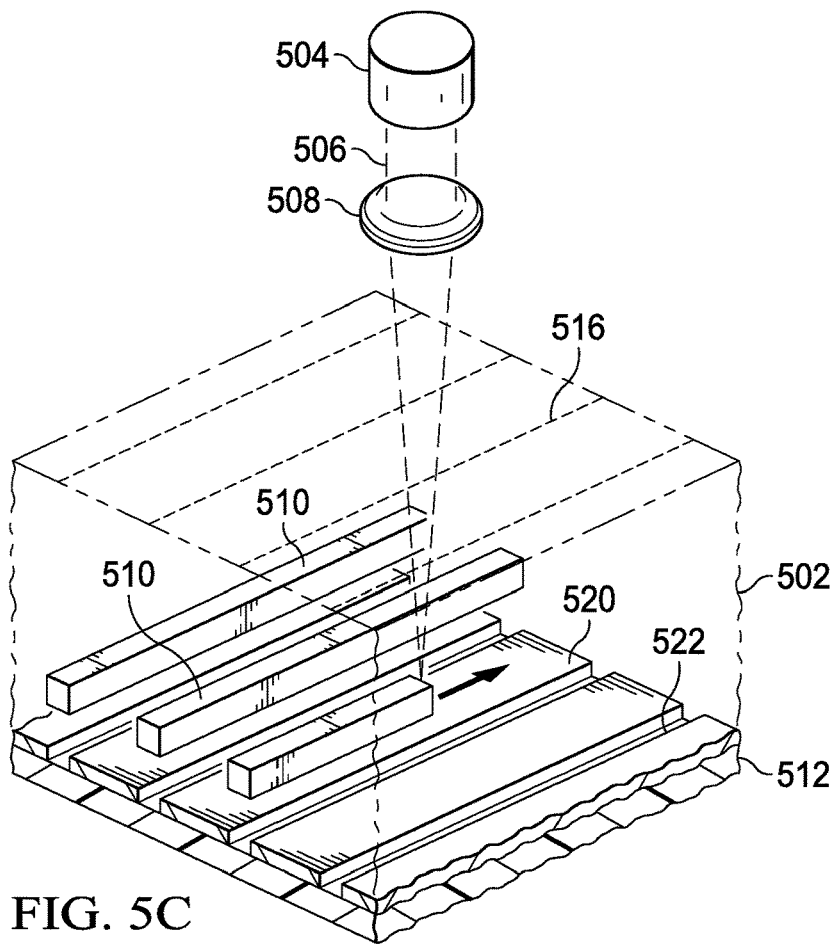
Figure 5D:
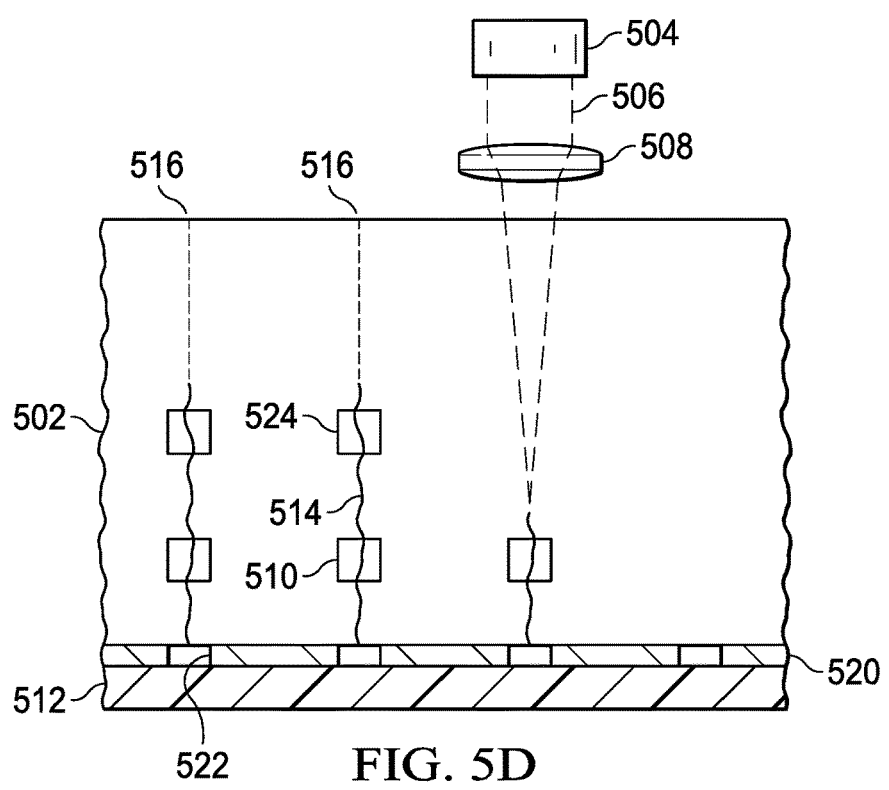

As is illustrated FIGS. 5C and 5D the laser power and focus depth is next adjusted for stealth dicing (see step 809 in FIG. 8). A first SD pass to form polysilicon stress regions is now performed. The process conditions for the first SD pass are listed in Table 3. During the first SD pass, the IR beam 506 is split into two 1.1 Watt IR beams, with one beam focused to a depth of 38 microns and the other beam focused to a depth of 28 microns as measured from the non-device side of the semiconductor wafer 502. For clarity of illustration, only the beam with a focal depth of 38 microns is shown in FIGS. 5C and 5D.

As shown in FIG. 5C the power of IR beam 406 from the laser 504 is adjusted to 1.1 Watt and is now refocused into the non-device side of the single crystal semiconductor wafer 502 to a focal depth of 38 microns. The power density of the IR beam 506 at the focal point is sufficient to locally melt the single crystal semiconductor wafer 502 converting it into polycrystalline silicon as it cools. The volume of the polycrystalline layer 510 is larger than the volume of the surrounding single crystal substrate, causing stress. The stress causes cracks 514 to form in the single crystal semiconductor wafer 502. When the dicing tape is later stretched, the stress causes cracks to propagate through the semiconductor wafer in the scribe streets, separating the singulated semiconductor dies one from another.

As shown in FIG. 5D, two polycrystalline regions, 510 and 524, are formed with the split IR beams. The second polycrystalline region 524 is vertically displaced in the scribe street 516 from the first polycrystalline region 510. In the example process listed in Table 2, the second polycrystalline region 524 is vertically displaced from the first polycrystalline region 510 by a distance of 10 microns to a depth from the non-device side of the single crystal semiconductor wafer of 28 microns. The stress causes a crack 514 to form in the scribe street 516 with an orientation perpendicular to the device side and non-device side of the single crystal semiconductor wafer 502. The SD process conditions listed in Table 3 are for a silicon semiconductor wafer approximately 55 um thick. Other process conditions, such as power, focal depth, and scan speed can be used for other wafer thicknesses and for alternative semiconductor wafer types such as silicon germanium.

Figure 5E:
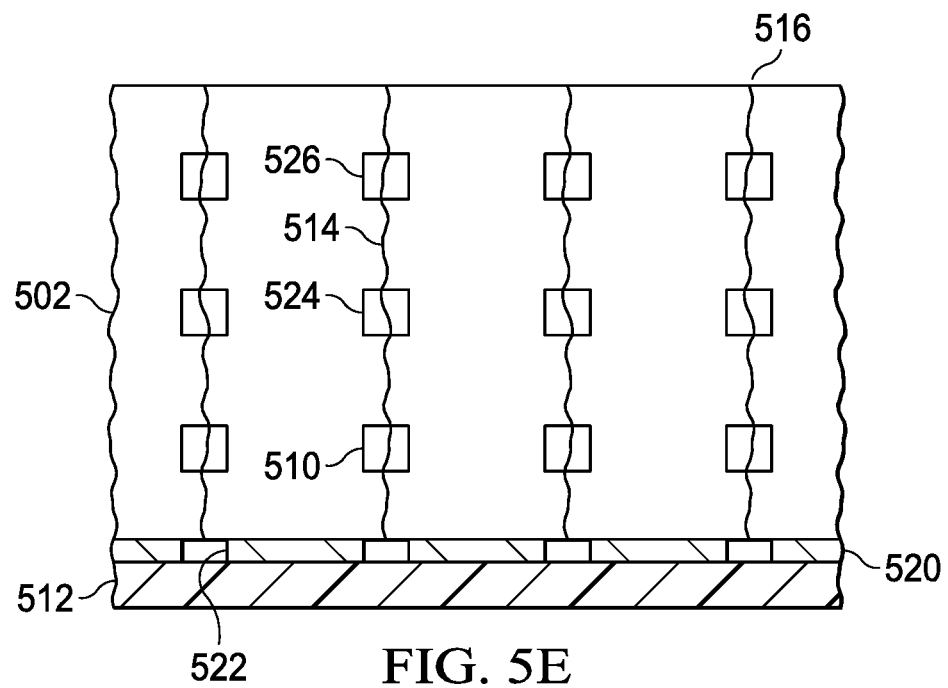

FIG. 5E shows a cross section of the single crystal semiconductor wafer 502 after completion of the metal ablation plus SD processes. In the example process used for illustration listed in Table 3, a third SD pass is performed with the laser 504 energy adjusted to 1.4 W and the IR beam 506 from laser 504 refocused to a depth of 14 microns. As shown in FIG. 5E a third polycrystalline region 528 is formed vertically displaced from the first and second polycrystalline regions, 510 and 524, in the scribe street 516. This third polycrystalline region 528 causes the crack 514 due to the stress to lengthen. The crack 514 is extended along the scribe street 516 from the device side to the opposing non-device side of the single crystal semiconductor wafer 502.

Figure 5F:
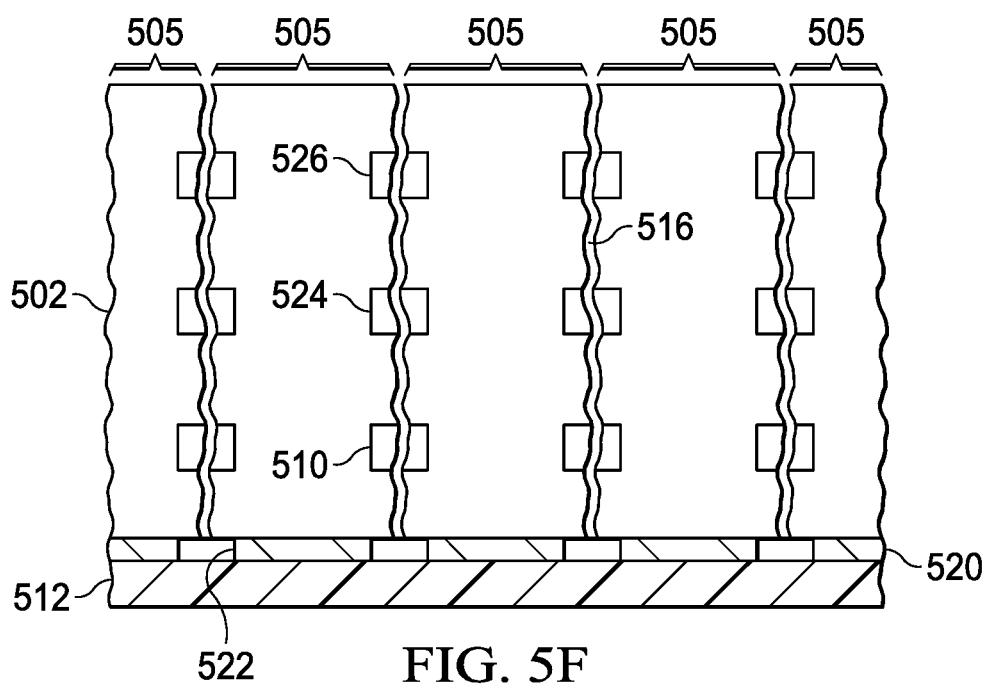

FIG. 5F illustrates the semiconductor wafer 502 after the dicing tape 512 is stretched according to the standard procedure. The stretching opens the cracks 514 along the scribe streets 516 between the semiconductor device dies 505.

The metal ablation plus SD procedure is illustrated along scribe streets 516 in a first direction in FIGS. 5A through 5F. In manufacturing, the metal ablation plus SD procedure is also repeated along scribe streets in a second direction that is perpendicular to the first direction prior to stretching the dicing tape 512 to complete the SD die singulation process (step 811 in FIG. 8). In this way the semiconductor device dies 505 are singulated to have four sides, with a peripheral edge corresponding to the scribe street locations on all four sides.

Figure 6A:
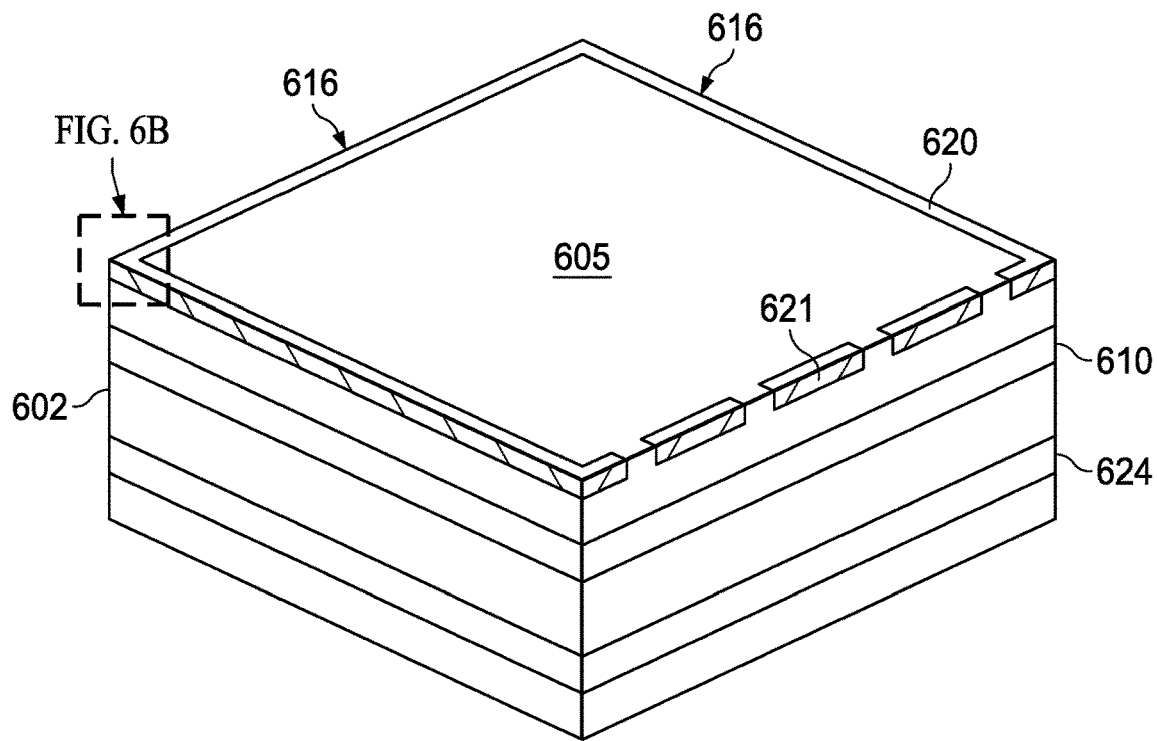
FIG. 6A is a projection view of a semiconductor device die that is singulated using laser metal ablation and stealth dicing.

FIG. 6A shows in a projection view a portion of a semiconductor device die 605 singulated using an arrangement including laser metal ablation plus stealth dicing. The edges of the scribe streets 616 at the periphery of semiconductor device die 605 show regions of polysilicon, 610 and 624, formed during the SD process. These regions of polysilicon, 610 and 624, lie in parallel with the device and non-device side surfaces of the die 605.

Figure 6B:
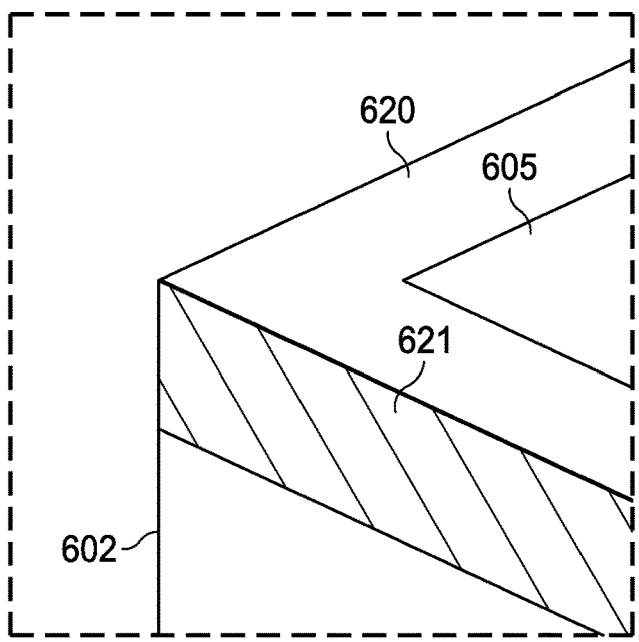
FIG. 6B is a close up projection view of a metal layer partially ablated using laser metal ablation.

FIG. 6B shows an expanded view of a corner of a semiconductor device die with the exposed edge 621 of a layer of metal 620 that has been cut through in the scribe street 610 using laser ablation as described herein. During the laser ablation process, the metal 620 in the scribe street 610 affected by the laser energy reaches melting temperature. Surface tension forms smoothed edges and surfaces during cooling of the metal 620. In contrast to edges of metal formed under laser ablation as in the arrangements, edges of mechanically sawed metal remain sharp. The smooth edges 621 of the layer of metal 620 on the surface of the device side of the die 605 are seen to be ablated and not sawed.

By performing a laser metal ablation step followed by the SD singulation process, metal bridging (see 418 in FIG. 4B) in scribe streets 616 is completely avoided or reduced. In an example arrangement, performing both steps in the same laser tool makes the process particularly cost effective. In an alternative arrangement, the laser ablation and the SD singulation processes are formed in different laser tools.

In an example, a singulated semiconductor die has an ablated metal edge at the periphery that has dark ovals where the laser beam was focused in the metal layer. The dark ovals result from the laser pulses as the laser beam scans the metal layer. The metal appears dark or burned in the regions where the laser was focused on the metal layer, and these regions may be spaced from each other by metal that was not burned or damaged, with the spacing corresponding to the frequency of the laser and the scanning speed of the laser. The ablation damage will extend from the top (metal layer portion farthest from the semiconductor surface) to the bottom (metal layer portion closest to the semiconductor surface) of the metal layer that was ablated. The metal layer may appear perforated with affected areas spaced by unaffected areas, spacing between the affected areas will correspond to the frequency of the laser beam.

Similarly the polycrystalline regions formed by the stealth dicing passes made after the laser ablation processes will have polycrystalline regions that are spaced from one another in the silicon material of the semiconductor wafer by a spacing that corresponds to the laser frequency and the scanning speed used. These parameters are changeable in the laser machine. The polycrystalline regions will be at different depths as described above and can be continuous if the frequency and scanning speed are such that all of the silicon is affected, alternatively the polycrystalline regions may be spaced by silicon regions if the laser frequency and scanning speeds are set to create these spaced polycrystalline regions. The polycrystalline regions appear dark in a side view of the peripheral edge of the semiconductor dies after singulation and exhibit a vertical repetitive up and down pattern that corresponds to the pulsed laser frequency.

In contrast to semiconductor dies that are singulated by mechanical sawing operations, the peripheral edges of the semiconductor dies formed by use of the laser metal ablation and stealth dicing of the arrangements, the peripheral edges of the semiconductor dies formed by the arrangements will be smooth and free from chipping and cracking that appear at the periphery of semiconductor dies formed using mechanical sawing processes for singulation.

Modifications are possible in the described examples, and other alternative arrangements are possible within the scope of the claims.

What is claimed is:

1. An apparatus, comprising:
   a semiconductor device die including a device side and an opposing non-device side, the semiconductor device die singulated along a scribe street at a peripheral edge of the semiconductor device die; and
   a metal layer with an ablated edge on a portion of the peripheral edge of the semiconductor device die, wherein the ablated edge lies on a top surface and a side surface of the device side.

2. The apparatus of claim 1, in which the ablated edge of the metal layer results from the semiconductor device die being singulated from the semiconductor wafer using a laser metal ablation.

3. The apparatus of claim 2 including at least one polycrystalline region in the semiconductor material of the semiconductor device die along the peripheral edge of the semiconductor device die.

4. The apparatus of claim 1, wherein the ablated edge is on a device side surface of the semiconductor wafer.

5. The apparatus of claim 1, wherein the ablated edge is in the metal layer that is an aluminum layer.

6. The apparatus of claim 1, wherein the ablated edge is in the metal layer that is a copper layer.

7. The apparatus of claim 1, wherein the semiconductor wafer is of single crystal silicon.

* * * * *